(12) United States Patent
Erba et al.

(10) Patent No.: US 7,088,169 B2
(45) Date of Patent: Aug. 8, 2006

(54) LOW-NOISE, HIGH-LINEARITY ANALOG MULTIPLIER

(75) Inventors: Simone Erba, Magenta (IT);
Giampiero Montagna, Tortona (IT);
Mario Valla, Vigevano (IT)

(73) Assignee: Stmicroelectronics, S.R.L., Agrate Brianza (IT)

( * ) Notice: Subject to any disclaimer, the term of this patent is extended or adjusted under 35 U.S.C. 154(b) by 0 days.

(21) Appl. No.: 10/781,975

(22) Filed: Feb. 18, 2004

(65) Prior Publication Data
US 2004/0227559 A1   Nov. 18, 2004

(30) Foreign Application Priority Data
Feb. 18, 2003   (EP)   .................................. 03425092

(51) Int. Cl.
*G05F 7/44*   (2006.01)
*G05G 7/16*   (2006.01)

(52) U.S. Cl. ..................................... 327/359

(58) Field of Classification Search ................ 327/356, 327/359; 455/226, 333, 326
See application file for complete search history.

(56) References Cited

U.S. PATENT DOCUMENTS

| | | | |
|---|---|---|---|
| 5,678,224 A | 10/1997 | Murtojarvi | ................... 455/326 |
| 6,404,263 B1 * | 6/2002 | Wang | ......................... 327/359 |
| 6,472,925 B1 * | 10/2002 | Komurasaki et al. | ....... 327/361 |
| 2002/0004376 A1 * | 1/2002 | Lee et al. | .................... 455/326 |
| 2003/0169089 A1 * | 9/2003 | Manku et al. | .............. 327/359 |

FOREIGN PATENT DOCUMENTS

| | | | |
|---|---|---|---|
| CA | 2244302 A1 * | 4/1999 |
| DE | 3409 555 A1 | 10/1984 |
| EP | 0 961 398 A1 | 12/1999 |
| EP | 03 42 5092 | 7/2003 |

OTHER PUBLICATIONS

Manstretta D et al; "A 3.18/spl mu/m CMOS directi conversion receive front-end for UMTS".
ISSCC 2002/ Session 14 / Cellular RF Wireless / 14.6 vol. 1, 2002, pp. 240-463, XP010585550.

* cited by examiner

*Primary Examiner*—Quan Tra
(74) *Attorney, Agent, or Firm*—Lisa K. Jorgenson; Bryan A. Santarelli; Graybeal Jackson Haley LLP

(57) ABSTRACT

An analog multiplier for multiplying a first analog voltage signal at a first frequency by a second analog voltage signal at a second frequency, comprising a first stage for converting the first analog voltage signal into a first and a second current signals, and a second stage comprising a first and a second cross-coupled current-switching pairs, driven by the second voltage signal, the first and second current-switching pairs having respective current inputs for receiving the first and the second current signals, respectively. Parasitic capacitances are inherently associated with each current input of the current-switching pairs. A compensation circuit is coupled to the current inputs of the current-switching pairs for compensating the parasitic capacitances.

30 Claims, 2 Drawing Sheets

LOW-NOISE, HIGH-LINEARITY ANALOG MULTIPLIER

PRIORITY CLAIM

This application claims priority from European patent application No. 03425092.8, filed Feb. 18, 2003, which is incorporated herein by reference.

TECHNICAL FIELD

The present invention relates generally to the field of analog electronic circuits, and more particularly to analog multipliers, e.g. mixers used for Radio-Frequency (RF) telecommunications.

BACKGROUND

Analog multipliers, i.e. circuits that takes two analog input signals and produce an output signal proportional to the product of the input signals, are frequently used in analog signal processing.

In particular, analog multipliers or mixers are widely used in modern communication systems in order to realize frequency conversion or translation of modulated signals.

The mixers can be classified as passive and active. Active mixers employ switching transistor pairs for current commutation, such as the so-called Gilbert cell.

A typical Gilbert cell mixer comprises a differential transconductance stage, used to convert an input Radio-Frequency (RF) voltage signal (the RF modulated signal to be converted) into a differential current signal. The differential current signal is fed to two pairs of current switches or switching pairs (quad), which are cross-coupled to one another and are controlled by a voltage signal generated by a local oscillator, so as to perform a current commutation. A differential current signal generated by the two switching pairs can be fed to a load, e.g. a purely resistive load, so as to produce an output voltage.

Active mixers are particularly attractive, and are frequently used in telecommunication applications, because they offer advantages over passive mixers, such as high conversion gain and good port-to port isolation.

In particular, active mixers fabricated in MOS or CMOS technology are desirable, because they can be easily integrated in a semiconductor chip together with other analog or logic circuits.

High linearity, i.e. low intermodulation distortion, and low noise are important features in a mixer, because they greatly affect the dynamic range of most communication systems.

If properly sized, the MOSFETs used in the input stage of an active mixer demonstrate fairly good linearity. The distortion of the two switching pairs is more complex to analyze and depends both on the speed of the switching pairs and on parasitic capacitances (both linear and non linear) at the nodes where the differential current signal generated by the transconductance stage is fed to the two switching pairs (the common source nodes of the switching pairs).

A problem in active mixers, especially those realized in MOS or CMOS technology, is however represented by flicker or 1/f noise. It is known that the main source of this kind of noise are the MOSFETs in the two switching pairs.

In a MOS- or CMOS-technology Gilbert cell mixer, a trade-off between noise and linearity performances exists.

The main limitations to high linearity and low noise come from the switching pairs. In fact, for the transconductance stage, the trade-off can be broken at the price of a higher power consumption.

The flicker noise contribution of the switching stage could be reduced using low biasing currents and large area MOSFETs. Unfortunately, this would increase the parasitic capacitances and reduce the switching speed. The results would be a degraded linearity. This effect is due to the non-linear partition of the signal current between the switching MOSFETs and the parasitic capacitances at the common source nodes of the switching pairs.

Thus, flicker noise reduction and increase of linearity have conflicting requirements: while low biasing currents and large MOSFETs are required to reduce the flicker noise, high biasing currents and small parasitic capacitances are required to enhance linearity.

The linearity problem is worsened by the high common-mode signal at twice the frequency of the signal generated by the local oscillator present at the common source nodes of the switching pairs; such common-mode signal originates from the rectification of the large signal produced by the local oscillator. This is particularly true for switching pairs in MOS- or CMOS-technology.

In D. Manstretta et al., "A 0.18 μm CMOS Direct Conversion Receiver Front-END for UMTS", ISSCC 2002, Session 14, Cellular RF Wireless, Paper 14.6, a solution to overcome this effect has been suggested, consisting of a common-mode LC filter resonating at twice the frequency of the local oscillator signal. In particular, the common-mode LC filter includes two capacitors and one inductor; each capacitor has a first plate connected to the common source node of a respective switching pair, and a second plate connected to a first terminal of the inductor; the second terminal of the inductor is connected to ground.

Thanks to the provision of the common-mode LC filter, the oscillation amplitude of the common source nodes of the switching pairs is greatly reduced, by virtue of the low impedance shown by the filter at twice the frequency of the local oscillator signal. The result is a considerable improvement in linearity.

A drawback of this solution is that as far as the differential radio-frequency signal is concerned, the filter behaves as a capacitor connected between the common source nodes of the quad, and thus worsens the flicker noise performance of the mixer.

SUMMARY

In view of the state of the art outlined above, an embodiment of the present invention improves the performance of analog multipliers, particularly Gilbert cell analog multipliers.

In particular, this embodiment of the present invention provides an analog multiplier design featuring increased linearity and reduced noise.

Even more in particular, ithis embodiment of the present invention achieves such increased linearity and reduced noise without significantly increasing the circuit complexity.

Briefly stated, an analog multiplier according to this embodiment of the invention comprises:

a first stage for converting a first analog voltage signal, for example the modulated radio-frequency signal, into a first and a second current signals;

a second stage, comprising a first and a second cross-coupled current-switching pairs driven by a second voltage signal, for example generated by a local oscillator, and having respective current inputs for receiving the first and the second current signals, respectively.

A compensation circuit is coupled to the current inputs of the current-switching pairs, for compensating parasitic capacitances associated with each of said current inputs of the current-switching pairs.

BRIEF DESCRIPTION OF DRAWINGS

These and other features and advantages of the present invention will be made apparent by the following detailed description of some embodiments thereof, provided merely by way of non-limitative example, which will be made in connection with the attached drawings, wherein.

DETAILED DESCRIPTION

Figure 1:
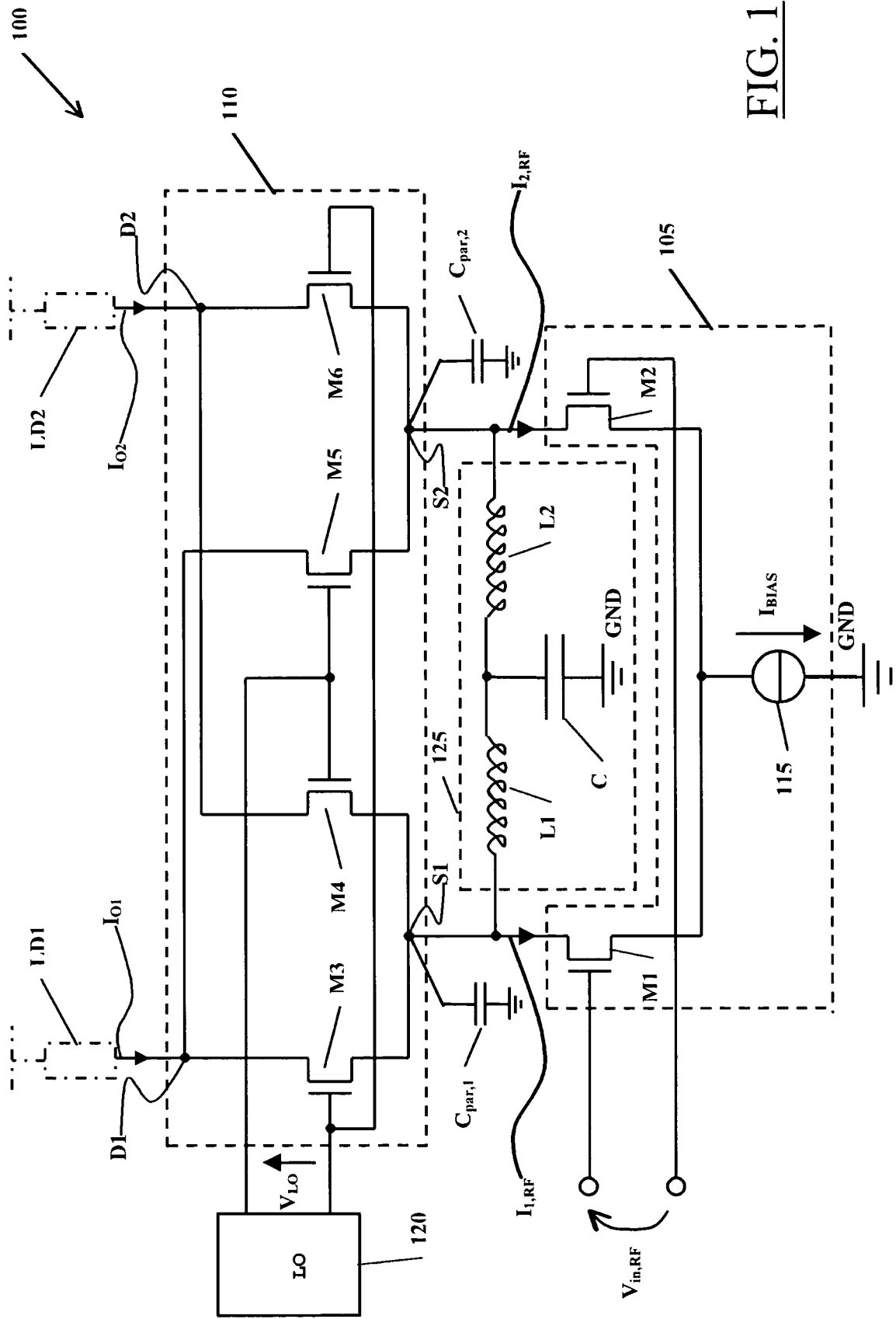
FIG. 1 shows a circuit diagram of an active mixer according to an embodiment of the present invention.

With reference to FIG. 1, an active mixer 100 according to an embodiment of the present invention is shown; in particular, the active mixer 100 is of the type widely used in telecommunication systems for frequency translation of the modulated signals, and includes a Gilbert cell multiplier.

The mixer 100 conventionally comprises a first stage, or input stage 105, and a second stage, or output stage 110, connected in cascade.

The input stage 105 is a differential transconductance stage, with a differential input receiving an input voltage signal $V_{in,RF}$; in particular, the input voltage signal $V_{in,RF}$ is a modulated radio-frequency (RF) signal, oscillating at a frequency $f_{RF}$.

The input stage 105 converts the input voltage signal $V_{in,RF}$ into a first and a second current signals $I_{1,RF}$, $I_{2,RF}$. In particular, the input voltage signal $V_{in,RF}$ is applied to gate electrodes of a source-coupled pair of N-channel MOSFETs M1, M2, biased by a bias current generator 115 connected to the coupled source electrodes of the MOSFETs M1 and M2 and generating a bias current $I_{BIAS}$. The differential output of the input stage 105 is formed by the drain electrodes of the MOSFETs M1 and M2.

The output stage 110 comprises two cross-connected source-coupled pairs of N-channel MOSFETs M3, M4 and M5, M6. A common source node S1 of the source-coupled MOSFETs M3 and M4 is connected to the drain electrode of the MOSFET M1 in the input stage 105, while a common source node S2 of the source-coupled MOSFETs M5 and M6 is connected to the drain electrode of the MOSFET M2 in the input stage 105.

A locally generated voltage signal $V_{LO}$ is applied to gate electrodes of the MOSFETs M3 and M4, and to gate electrodes of the MOSFETs M5 and M6. The locally-generated voltage signal $V_{LO}$, oscillating at a prescribed frequency $f_{LO}$, is typically generated by a local oscillator 120 connected to the gate electrodes of the MOSFETs M3, M4, M5 and M6. Cross-connection of the two source-coupled MOSFET pairs M3, M4 and M5, M6 is achieved by connecting a drain electrode of the MOSFET M5 to a drain electrode of the MOSFET M3, and connecting a drain electrode of the MOSFET M4 to a drain electrode of the MOSFET M6.

The output stage 110 has a differential output formed by the common drain node D1 of the MOSFETs M3 and M5, and the common drain node D2 of the MOSFETs M4 and M6. The output stage 110 provides a differential output current equal to the difference between a first output current $I_{O1}$ (the sum of the drain currents of the MOSFETs M3 and M5) and a second output current $I_{O2}$ (the sum of the drain currents of the MOSFETs M4 and M6).

In other words, the Gilbert cell multiplier is formed by the series connection of a source-coupled MOSFET pair (the MOSFET pair M1 and M2) with two cross-coupled, source-coupled MOSFET pairs (the MOSFET pair M3 and M4, and the MOSFET pair M5 and M6).

A load, schematized in the drawing by load elements LD1, LD2, is normally connected to the output of the output stage 110, so that the differential output current of the output stage 110 is converted into a differential voltage.

Also schematically shown in the drawing are capacitors $C_{par,1}$ and $C_{par,2}$, connected between the common source nodes S1 and S2, respectively, of the source-coupled MOSFET pairs M3, M4 and M5, M6 and a reference voltage (ground) GND. These capacitors $C_{par,1}$ and $C_{par,2}$ represent, in terms of lumped circuit elements, parasitic capacitances associated with the common source nodes S1 and S2; the main contribution to such parasitic capacitances are the capacitances associated with the PN source junctions of the MOSFETs M3, M4, M5 and M6.

As mentioned in the introduction of the present description, the parasitic capacitances $C_{par,1}$ and $C_{par,2}$ affect the linearity of the mixer: high parasitic capacitance values degrade the linearity of the mixer, due to a non-linear partition of the current signal $I_{1,RF}$, $I_{2,RF}$ between the MOSFETs M3, M4, M5 and M6 and the capacitors $C_{par,1}$ and $C_{par,2}$.

According to an embodiment of the present invention, an LC filter 125 is provided, coupled to the common source nodes S1 and S2. In particular, the LC filter 125 is a "T" filter, comprising a first and a second inductors L1 and L2, with a first terminal connected to the common source nodes S1 and S2, respectively, and a second terminal connected to a first plate of a capacitor C, having a second plate connected to the ground GND.

Figure 2:
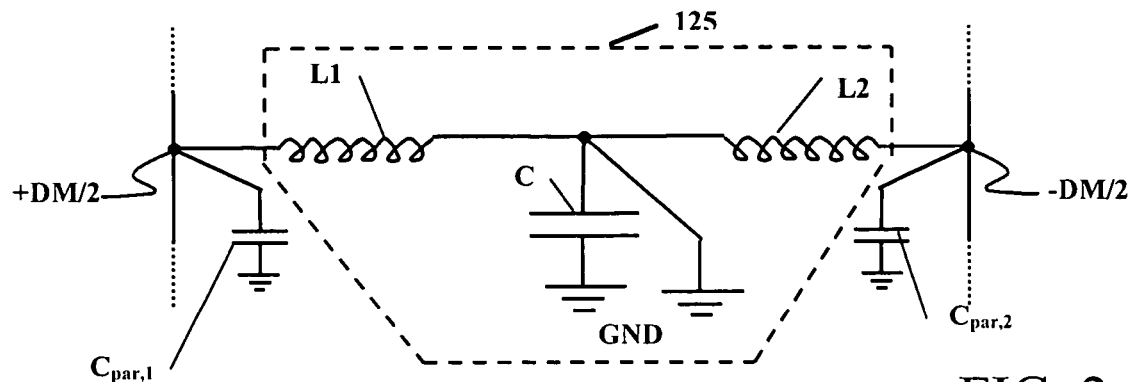
FIGS. 2 and 3 show equivalent circuit diagrams of the mixer of FIG. 1 helpful for analysing the behavior thereof for differential-mode signals and common-mode signals, respectively.

As visible from the differential-mode equivalent circuit diagram of FIG. 2, the filter 125 acts as a parallel resonator for differential signals at a parallel resonance frequency $f_p$ equal to:

$$f_p = \frac{1}{2\pi\sqrt{L \cdot C_{par}}}$$

where L is the inductance value of the two inductors L1, L2, and $C_{par}$ is the capacitance value of the capacitors $C_{par,1}$ and $C_{par,2}$.

Figure 3:
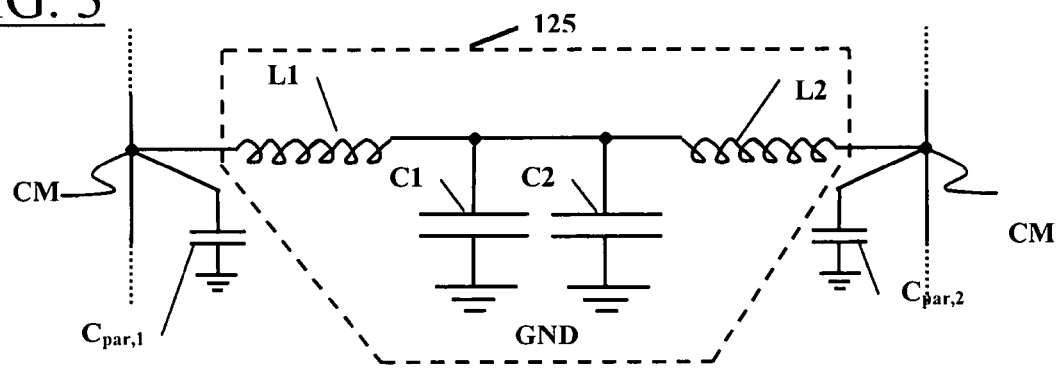

As visible from the common-mode equivalent circuit diagram of FIG. 3, the filter 125 acts instead as a series resonator for common-mode signals at a series resonance frequency $f_s$ equal to:

$$f_s = \frac{1}{2\pi\sqrt{L \cdot \frac{C}{2}}}$$

where C is the capacitance value of the capacitor C.

By sizing the inductance L of both the inductors L1 and L2 so that the parallel resonance frequency $f_p$ is equal to $f_{RF}$ (the frequency of the radio-frequency input signal), the parallel resonance of the filter 125 causes the parasitic capacitances $C_{par,1}$ and $C_{par,2}$ to be cancelled, thereby improving the mixer performance in terms of linearity. In fact, the effect of non-linear partition of the currents $I_{1,RF}$, $I_{2,RF}$ between the MOSFETs M3, M4, M5 and M6 and the capacitances $C_{par,1}$ and $C_{par,2}$ is substantially eliminated.

In addition to improving the linearity of the mixer, the parallel resonance of the filter 125 also contributes to reducing the flicker noise. In fact, as reported in H. Darabi and A. A. Abidi, "Noise in RF-CMOS Mixers: A simple Physical Model", IEEE Transactions on Solid State Circuits, Vol. 35, No. 1, January 2000, pages 15 to 25, the parasitic capacitances $C_{par,1}$ and $C_{par,2}$ are charged and discharged by the flicker noise of the output stage 110 every oscillation period of the local oscillator 120, and thus cause this current noise to flow to the output of the mixer. By cancelling the capacitances $C_{par,1}$ and $C_{par,2}$, the filter 125 substantially eliminates or strongly attenuates this contribution to the flicker noise. Moreover, the inductors L1 and L2 short to ground the current flicker noise coming from the differential pair that will not be up-converted because of mismatches between the MOSFETs of the two source-coupled pairs.

By sizing the capacitance of the capacitor C in such a way that $f_s$ is equal to twice the local oscillator oscillation frequency $f_{LO}$, the series resonance of the filter 125 cancels the common-mode signals at twice the frequency $f_{LO}$ present at the common source nodes S1 and S2, deriving from the rectification of the large signal $V_{LO}$ generated by the local oscillator. This improves the linearity of the mixer.

In other words, by properly sizing the inductance of the inductors L1 and L2 and the capacitance of the capacitor C, the filter 125 is made to behave as a short-circuit to the ground GND for common-mode signals at twice the frequency $f_{LO}$ of the local oscillator 120, and as an open circuit for differential signals at the frequency $f_{RF}$ of the radio-frequency input signal $V_{in,RF}$.

It is observed that, in the practice, the two inductors L1 and L2 can be replaced by a single, differential inductor having overall inductance equal to twice the inductance of each of the two inductors L1 and L2, with a center tap for the connection to the plate of the capacitor C.

Thanks to the provision of the filter 125, the trade-off normally existing in mixers between linearity and (flicker) noise performance can be broken.

The mixer according to this embodiment of the present invention is particularly adapted for front-ends of RF receivers, especially for high-frequency applications such as third-generation wireless mobile telecommunication terminals (UMTS mobile phones) and high-frequency wireless LANs, where parasitic components are dominant.

Although the present invention has been disclosed and described by way of some embodiments, it is apparent to those skilled in the art that several modifications to the described embodiments, as well as other embodiments of the present invention are possible without departing from the scope thereof.

Figure 4:
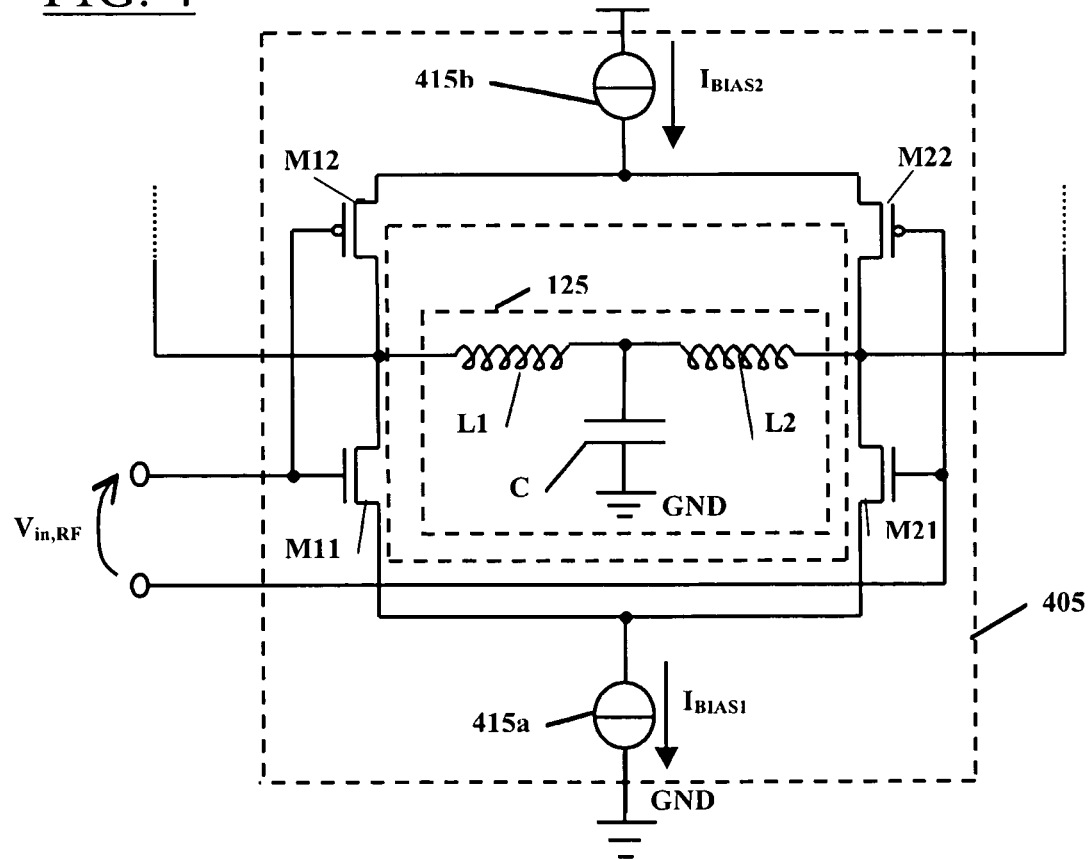
FIG. 4 shows an input stage of an active mixer according to an alternative embodiment of the present invention.

For example, FIG. 4 shows an alternative, CMOS transconductance stage 405, having N-channel MOSFETs M11 and M21 and P-channel MOSFETs M21 and M22 connected in series to each other in two circuit branches, with a low-side and a high-side bias current generators 415a and 415b.

In the practice, the filter 125 can be realized in several ways, with a different number and a different arrangement of components.

Furthermore, as discussed above, electronic systems such as, e.g., UMT's, wireless LANs, and cell phones may include the mixer 100.

What is claimed is:

1. An analog multiplier for multiplying a first analog voltage signal at a first frequency by a second analog voltage signal at a second frequency, comprising:
   a first stage for converting the first analog voltage signal into a first and second current signals;
   a second stage comprising a first and second cross-coupled current-switching pairs, driven by the second voltage signal, said first and second current-switching pairs having respective current inputs for receiving the first and the second current signals, respectively;
   parasitic capacitances associated with each of said current inputs of the current-switching pairs; and
   a compensation circuit coupled to the current inputs of the current-switching pairs for compensating said parasitic capacitances at said first frequency.

2. The analog multiplier of claim 1, in which an overall impedance of said compensation circuit and of said parasitic capacitances is substantially infinite at said first frequency.

3. The analog multiplier of claim 2, in which said compensation circuit includes a filter designed in such a way to form, together with said parasitic capacitances, a resonating circuit associated with the current inputs of the current-switching pairs and acting a parallel resonator for differential-mode signals at a parallel resonance frequency substantially equal to the first frequency.

4. The analog multiplier of claim 2, in which an overall impedance of said compensation circuit and of said parasitic capacitances is substantially zero at an integer multiple of said second frequency.

5. The analog multiplier of claim 3, in which said filter is further designed in such a way that said resonating circuit acts as a series resonator for common-mode signals at a series resonance frequency substantially equal to an integer multiple of the second frequency.

6. The analog multiplier of claim 5, in which the filter includes a "T"-shaped LC filter, with a first inductive reactance element coupled to a first one of said current inputs, a second inductive reactance element coupled to a second one of said current inputs, and a capacitive reactance element coupled the first and second inductive reactance elements.

7. The analog multiplier of claim 6, in which said first and second inductive reactance elements have a same inductive reactance value designed to make the parallel resonance frequency substantially equal to the first frequency, and the capacitive reactance element has a capacitive reactance value designed to make the series resonance frequency substantially equal to an integer multiple of the second frequency.

8. A method of improving linearity and reducing noise in an analog multiplier including a first stage for converting a first analog voltage signal at a first frequency into a first and a second current signals, and a second stage comprising a first and a second cross-coupled current-switching pairs, driven by a second voltage signal at a second frequency, said first and second current-switching pairs having respective current inputs for receiving the first and the second current signals, respectively, the method comprising:

compensating at said first frequency parasitic capacitances associated with said current inputs of the current-switching pairs.

9. The method of claim 8, in which said compensating comprises associating with said current inputs a circuit creating parallel resonators resonating at a frequency substantially equal to the first frequency.

10. The method according to claim 9, in which said compensating further comprises associating with said current inputs a circuit creating series resonators resonating at a frequency substantially equal to an integer multiple of the second frequency.

11. A mixer, comprising:

an input stage having an output node and operable to receive an input signal having a first frequency;

an output stage having an input node coupled to the output node and operable to receive a mixing signal having a second frequency; and a filter coupled to the output node, operable at the first frequency to function as a tank circuit having a parallel resonant frequency that is substantially equal to the first frequency, and operable at a harmonic of the second frequency to function as a tank circuit having a series resonant frequency that is substantially equal to the harmonic of the second frequency.

12. The mixer of claim 11 wherein the input signal comprises a carrier signal having the first frequency and an information signal having a third frequency that is significantly lower than the first frequency.

13. A mixer, comprising:

an input stage having first differential output nodes and operable to receive a differential input signal having a first frequency;

an output stage having first differential input nodes respectively coupled to the differential output nodes and operable to receive a differential mixing signal having a second frequency; and a filter comprising an inductance directly coupling the differential output nodes and a capacitor coupled between the inductance and ground.

14. The mixer of claim 13 wherein the input stage comprises:

differential input nodes operable to receive the input signal;

a current source;

a first transistor having a control node coupled to a first one of the differential input nodes, a first current conducting node coupled to the current source, and a second current conducting node coupled to a first one of the differential output nodes; and a second transistor having a control node coupled to a second one of the differential input nodes, a first current conducting node coupled to the current source, and a second current conducting node coupled to a second one of the differential output nodes.

15. The mixer of claim 13 wherein the input stage comprises:

differential input nodes operable to receive the input signal;

first and second current sources;

a first transistor having a control node coupled to a first one of the differential input nodes, a first current conducting node coupled to the first current source, and a second current conducting node coupled to a first one of the differential output nodes;

a second transistor having a control node coupled to a second one of the differential input nodes, a first current conducting node coupled to the first current source, and a second current conducting node coupled to a second one of the differential output nodes;

a third transistor having a control node coupled to the first one of the differential input nodes, a first current conducting node coupled to the second current source, and a second current conducting node coupled to the first one of the differential output nodes; and a fourth transistor having a control node coupled to the second one of the differential input nodes, a first current conducting node coupled to the second current source, and a second current conducting node coupled to the second one of the differential output nodes.

16. The mixer of claim 13 wherein the output stage comprises:

second differential input nodes operable to receive the mixing signal;

second differential output nodes;

a first transistor having a control node coupled to a first one of the second differential input nodes, a first current conducting node coupled to a first one of the first differential input nodes, and a second current conducting node coupled to a first one of the second differential output nodes;

a second transistor having a control node coupled to a second one of the second differential input nodes, a first current conducting node coupled to the first one of the first differential input nodes, and a second current conducting node coupled to a second one of the second differential output nodes;

a third transistor having a control node coupled to the second one of the second differential input nodes, a first current conducting node coupled to a second one of the first differential input nodes, and a second current conducting node coupled to the first one of the second differential output nodes; and a fourth transistor having a control node coupled to the first one of the second differential input nodes, a first current conducting node coupled to the second one of the first differential input nodes, and a second current conducting node coupled to the second one of the second differential output nodes.

17. The mixer of claim 13, further comprising:

a reference node; and wherein the filter comprises, a first inductive element having a first node coupled to a first one of the first differential output nodes of the input stage and having a second node, a second inductive element having a first node coupled to a second one of the first differential output nodes and having a second node, and a capacitive element having a first node coupled to the second nodes of the first and second inductive elements and having a second node coupled to the reference node.

18. The mixer of claim 13, further comprising:
a reference node; and
an inductive element having first and second nodes respectively coupled to the first differential output nodes of the input stage and having a tap, and
a capacitive element having a first node coupled to the tap and having a second node coupled to the reference node.

19. The mixer of claim 13 wherein the filter has a series resonant frequency that is substantially equal to a second harmonic of the second frequency.

20. An electronic system, comprising:
an oscillator operable to generate an oscillator signal having a second frequency;
a mixer, comprising,
an input stage having an output node and operable to receive an input signal having a first frequency,
an output stage having a first input node coupled to the output node, having a second input node coupled to the oscillator, and having an output node, and
a filter coupled to the first input node of the output stage, operable at the first frequency to function as a tank circuit having a parallel resonant frequency that is substantially equal to the first frequency, and operable at a harmonic of the second frequency to function as a tank circuit having a series resonant frequency substantially equal to the harmonic of the second frequency; and
a load coupled to the output node of the output stage.

21. A method, comprising:
mixing a first signal having a first frequency with a second signal having a second frequency to generate a resulting signal having a linearity and a component having a third frequency that is a harmonic of the second frequency;
forming a parallel resonator having a parallel resonant frequency that is substantially equal to the first frequency; and
forming a series resonator having a series resonant frequency substantially equal to the third frequency.

22. The method of claim 21 wherein forming the parallel resonator comprises increasing an impedance at the first frequency.

23. The method of claim 21 wherein forming the series resonator comprises decreasing an impedance at the third frequency.

24. A circuit, comprising:
a differential input stage having first and second input nodes operable to receive a signal having a first freguency and first and second output nodes that respectively have first and second capacitances; and
a filter coupled to the first and second output nodes and operable to form at substantially the first frequency first and second parallel resonant tank circuits with the first and second capacitances, respectively.

25. The circuit of claim 24 wherein the input stage further comprises first and second output nodes operable to receive a signal having a second frequency, and wherein the filter is operable to form at substantially the second frequency first and second series resonant tank circuits with the first and second capacitances, respectively.

26. A method, comprising:
mixing a first signal having a first frequency with a second signal having a second frequency with a mixer having an input stage coupled to an output stage at first and second nodes;
forming between a reference node and the first and second nodes respective first and second parallel resonators each having a respective parallel resonant frequency that is substantially equal to the first frequency; and
forming between the reference node and the first and second nodes respective first and second series resonators each having a respective series resonant frequency substantially equal to a harmonic of the second frequency.

27. The method of claim 26 wherein generating a parallel resonant frequency comprises forming first and second parallel resonant circuits between the reference node and the first and second nodes, respectively, at the first frequency.

28. The method of claim 26 wherein generating a series resonant frequency comprises forming first and second series resonant circuits between the reference node and the first and second nodes, respectively, at the second frequency.

29. The mixer of claim 13 wherein the inductance comprises first and second inductors.

30. The circuit of claim 25, further comprising:
a reference node; and
wherein the filter comprises:
a first inductive element having a first node coupled to a first one of the first differential output nodes of the input stage and having a second node,
a second inductive element having a first node coupled to a second one of the first differential output nodes and having a second node, and
a capacitive element having a first node coupled to the second nodes of the first and second inductive elements and having a second node coupled to the reference node.

* * * * *